(12) United States Patent
Owaki

(10) Patent No.: US 11,271,364 B2
(45) Date of Patent: Mar. 8, 2022

(54) LASER DEVICE AND TRANSMITTER

(71) Applicant: Shimadzu Corporation, Kyoto (JP)

(72) Inventor: Kazuma Owaki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 16/806,698

(22) Filed: Mar. 2, 2020

(65) Prior Publication Data
US 2020/0295531 A1 Sep. 17, 2020

(30) Foreign Application Priority Data

Mar. 11, 2019 (JP) .............................. JP2019-043473

(51) Int. Cl.
| | | |
|---|---|---|
| *H01S 5/06* | (2006.01) | |
| *H01S 5/026* | (2006.01) | |
| *H04B 10/564* | (2013.01) | |
| *H01S 5/024* | (2006.01) | |
| *H01S 5/023* | (2021.01) | |
| *H01S 5/0233* | (2021.01) | |
| *H01S 5/0235* | (2021.01) | |

(52) U.S. Cl.
CPC ............ *H01S 5/0265* (2013.01); *H01S 5/023* (2021.01); *H01S 5/024* (2013.01); *H01S 5/0233* (2021.01); *H01S 5/0235* (2021.01); *H01S 5/06* (2013.01); *H04B 10/564* (2013.01)

(58) Field of Classification Search
CPC ...... H01S 5/0265; H01S 5/023; H01S 5/0233; H01S 5/0235; H01S 5/06; H01S 5/024; H01S 5/06226; H01S 5/0427; H01S 5/0231; H01S 5/02345; H04B 10/564; H04B 10/504
See application file for complete search history.

(56) References Cited

U.S. PATENT DOCUMENTS

| | | | | |
|---|---|---|---|---|
| 6,118,562 | A * | 9/2000 | Lee ....................... | H01S 5/0687 398/1 |
| 6,724,791 | B1 * | 4/2004 | Chiappetta .......... | H01S 5/02415 372/36 |
| 2002/0163945 | A1 * | 11/2002 | Kwark .................. | H01S 5/0683 372/31 |
| 2003/0016711 | A1 * | 1/2003 | Crawford ................ | H01S 5/042 372/38.02 |

FOREIGN PATENT DOCUMENTS

| JP | 2008300488 A | * 12/2008 |
|---|---|---|
| JP | 2017-228889 A | 12/2017 |

* cited by examiner

*Primary Examiner* — Xinning(Tom) Niu
(74) *Attorney, Agent, or Firm* — Muir Patent Law, PLLC

(57) ABSTRACT

A laser device includes: a semiconductor laser, at least one driver that supplies the semiconductor laser with a current; a modulator that modulates the current supplied to the semiconductor laser; and at least one electric line for conveying the current from at least one driver to the semiconductor laser. The at least one electric line is a wire in a form of a tape, and includes the first conductive layer, the second conductive layer, and the insulating layer which are extending in the longitudinal direction of the wire. The first conductive layer and the second conductive layer are stacked, with the insulating layer in between, in the direction of thickness of the wire.

12 Claims, 8 Drawing Sheets

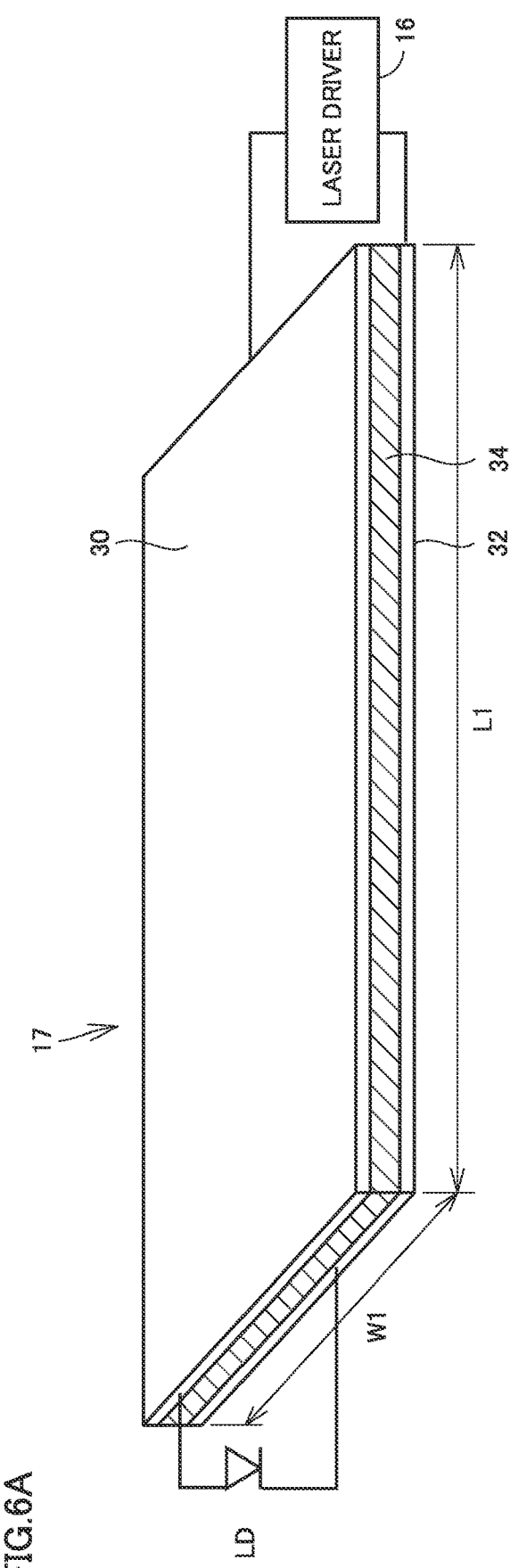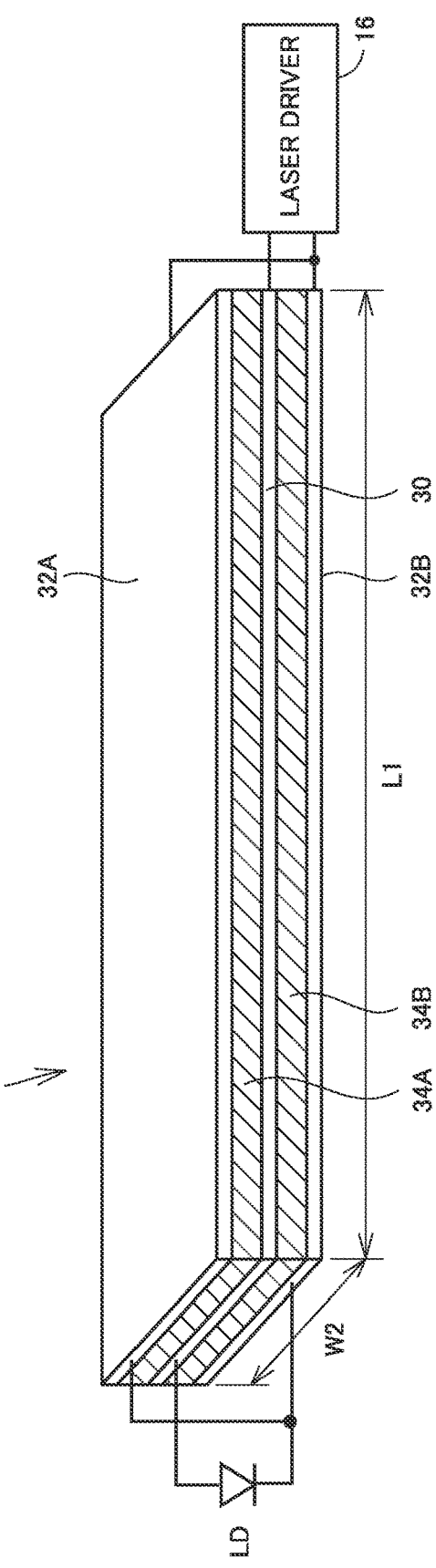

LASER DEVICE AND TRANSMITTER

BACKGROUND OF THE INVENTION

Field of the Invention

The present invention relates to a laser device and a transmitter.

Description of the Background Art

Japanese Patent Laying-Open No. 2017-228889 discloses an underwater communication system in which two communication devices, using 450 nm blue laser diodes having good transmission characteristics in the water, communicate with each other by exchanging laser light beams. The two communication devices each have a transmitter which transmits laser light to a peer communication device, and a receiver which receives laser light transmitted by the peer communication device.

The transmitter includes a modulation device, a laser driver, and a semiconductor laser. The modulation device outputs a modulated wave signal to a laser driver. The laser driver drives the semiconductor laser, using a current dependent on the modulated wave signal and power from a power supply device.

SUMMARY OF THE INVENTION

In the transmitter, an electric line is disposed between the laser driver and the semiconductor laser, via which a current is supplied to the semiconductor laser. The longer the length of the electric line, the greater the inductance the electric line has, ending up with an increased voltage drop in the electric line. If a voltage applied by the laser driver is increased in order to compensate for the voltage drop at the electric line, a concern is raised that high speed modulation of laser light becomes difficult. In order to reduce the voltage drop at the electric line, desirably, the length of the electric line is reduced by disposing the laser driver proximate to the semiconductor laser.

In contrast, a large current needs to pass through the semiconductor laser in order to output high power laser light. This also increases generation of heat by the semiconductor laser, requiring the installation of a cooler as a measure to address the heat dissipation by the semiconductor laser. Due to this, the laser driver is blocked by the cooler, limiting in disposing the laser driver proximate to the semiconductor laser. As a result, reduction in the length of the electric line is also limited.

Thus, the present embodiment provides a laser device and a transmitter which allow high speed modulation of a semiconductor laser, while ensuring the cooling performance of the semiconductor laser.

A laser device according to a first aspect of the present invention includes: a semiconductor laser; at least one driver that supplies the semiconductor laser with a current; a modulator that modulates the current to be supplied to the semiconductor laser; and at least one electric line for conveying the current from the at least one driver to the semiconductor laser. The at least one electric line is a wire in a form of a tape, and includes a first conductive layer, a second conductive layer, and an insulating layer that are extending in a longitudinal direction of the wire. The first conductive layer and the second conductive layer are stacked, with the insulating layer in between, in the direction of thickness of the wire.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6A is a diagram showing a design concept of the electric line according to the embodiment.

FIG. 6B is a diagram showing a design concept of the electric line according to the embodiment.

DESCRIPTION OF THE PREFERRED EMBODIMENTS

Figure 1:
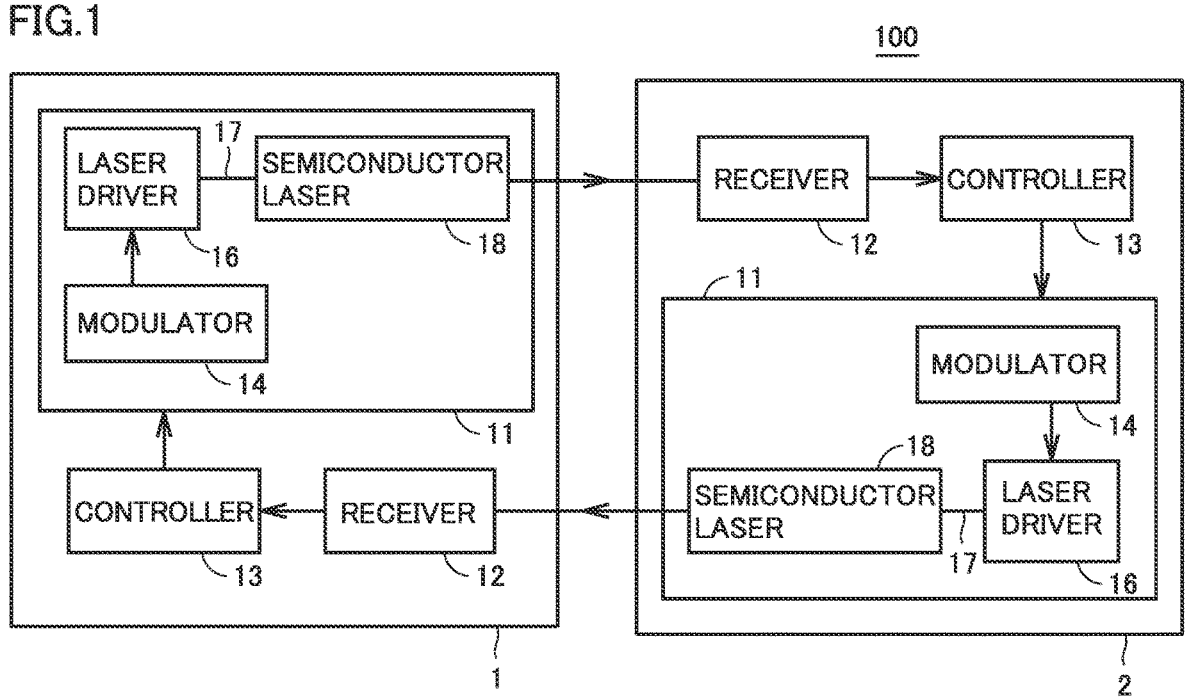
FIG. 1 is a diagram schematically showing an overall configuration of a communication system to which a laser device according to an embodiment of the present invention is applied.

Hereinafter, an embodiment of the present invention will be described in detail, with reference to the accompanying drawings. Note that, in the following, the same reference sign is used to refer to like or corresponding components in the drawings, and description thereof will in principle not be repeated.

FIG. 1 is a diagram schematically showing an overall configuration of a communication system to which a laser device according to an embodiment of the present invention is applied.

A communication system 100 according to the present embodiment is applicable to underwater communication systems in which laser communications are performed underwater. In an underwater communication system, laser light are exchanged between two communication devices using 450 nm blue laser diodes having good transmission characteristics in the water, thereby allowing the two communication devices to exchange data.

Referring to FIG. 1, in communication system 100 according to the present embodiment, a first communication device 1 and a second communication device 2 communicate with each other. First communication device 1 and second communication device 2 have the same device configuration, and thus a configuration of first communication device 1 will be described below.

First communication device 1 includes a transmitter 11, a receiver 12, and a controller 13. Transmitter 11 transmits laser light to second communication device 2. Transmitter 11 has a modulator 14, a laser driver 16, an electric line 17, and a semiconductor laser 18. Transmitter 11 corresponds to one embodiment of a "laser device".

Modulator 14 modulates information, and outputs to laser driver 16 a modulated wave signal (pulse signal) obtained by the modulation of the information. Laser driver 16 supplies a pulse current to semiconductor laser 18, in accordance with the modulated wave signal from modulator 14, thereby driving the semiconductor laser 18.

Electric line 17 is disposed between laser driver 16 and semiconductor laser 18. Electric line 17 conveys to semiconductor laser 18 a high frequency current (the pulse current) supplied from laser driver 16.

Semiconductor laser 18 has a laser diode not shown. The laser diode is, for example, a 450 nm blue laser diode or green laser diode.

Receiver 12 receives laser light transmitted by transmitter 11 included in second communication device 2. Controller 13 controls transmitter 11 and receiver 12.

Figure 2:
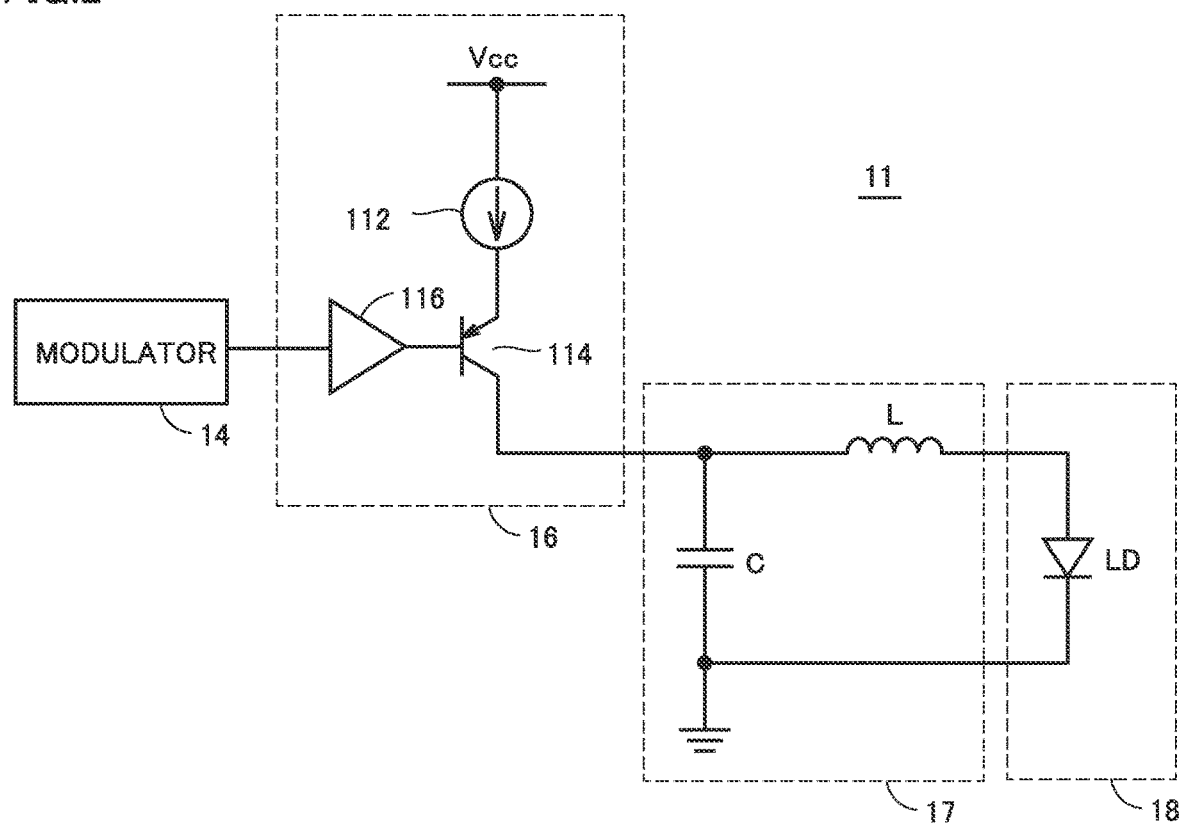
FIG. 2 is a diagram showing an example configuration of a transmitter shown in FIG. 1.

FIG. 2 is a diagram showing an example configuration of transmitter 11 shown in FIG. 1.

Referring to FIG. 2, laser driver 16 has a constant current source 112, a PNP transistor 114, and a buffer 116. PNP transistor 114 has an emitter connected to constant current source 112, a collector connected to semiconductor laser 18 via electric line 17, and a base connected to an output terminal of buffer 116.

Constant current source 112 passes a constant current through PNP transistor 114. Buffer 116 makes PNP transistor 114 conductive (on)/non-conductive (off) using the modulated wave signal (pulse signal), thereby passing a high frequency current through PNP transistor 114.

Semiconductor laser 18 is driven by the high frequency current supplied from PNP transistor 114 via electric line 17, and pumped. Semiconductor laser 18 has a laser diode LD for the pumping. Laser diode LD is pulsed by laser driver 16, and first communication device 1 thereby transmits laser light to second communication device 2.

Electric line 17 can be represented by an equivalent circuit formed of an inductance L and a capacitance C.

Figure 3:
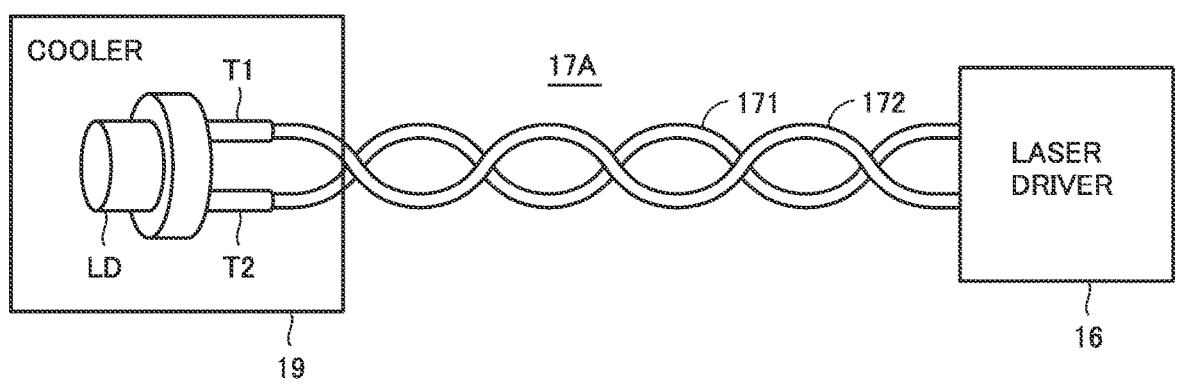
FIG. 3 is a diagram showing an electric line structure between a laser driver and a semiconductor laser, which is employed in a general transmitter.

FIG. 3 is a diagram showing an electric line structure between laser driver 16 and semiconductor laser 18, which is used in a general transmitter.

Referring to FIG. 3, an electric line 17A between laser driver 16 and laser diode LD is a twisted pair of wires configured of two wires 171, 172 being twisted. Wire 171 has a first end electrically connected to a cathode terminal T2 of laser diode LD, and a second end electrically connected to laser driver 16. Wire 172 has a first end electrically connected to an anode terminal T1 of laser diode LD, and a second end electrically connected to laser driver 16. Other than the twisted pair of wires shown in FIG. 3, a coaxial cable can be used as electric line 17A.

The twisted pair of wires convey the high frequency current output from laser driver 16 to supply it to laser diode LD. For example, reflection of the high frequency current is prevented by matching the characteristic impedance of the twisted pair of wires to the characteristic impedance of laser diode LD, thereby highly efficiently conveying the high frequency current.

In contrast, as the high frequency current increases in frequency, the current flows mainly on the surfaces of wires 171, 172. Thus, electric line 17A increases in AC resistance (high frequency resistance). Electric line 17A also increases in inductance with an increase in length. For this reason, the voltage drop increases with an increase in length of electric line 17A, consequently causing a concern that the attenuation of the high frequency current can be a problem.

In order to compensate for the attenuation of the high frequency current, laser driver 16 applies to laser diode LD a voltage increased by the voltage drop caused by electric line 17A. However, there is a concern that an increase of a voltage applied to laser diode LD can make high speed modulation of laser diode LD more difficult. In order to reduce the voltage drop at electric line 17A, desirably, the length of electric line 17A is reduced by disposing laser driver 16 proximate to laser diode LD.

In contrast, in semiconductor laser 18, energy that is not converted into light becomes heat. In order to output the high power laser light, a large current needs to be passed through laser diode LD, causing a concern that generation of heat by semiconductor laser 18 also increases. Thus, a cooler 19 is installed in order to efficiently cool the semiconductor laser 18. Cooler 19 is, for example, a heat sink. Laser diode LD is attached to the heat sink using a solder material.

As such, installation of cooler 19 is necessarily as a measure to address the heat dissipation of high power semiconductor laser 18. Due to this, laser driver 16 is blocked by cooler 19, limiting in disposing laser driver 16 proximate to laser diode LD. As a result, reduction in the length of electric line 17A is also limited.

Thus, the present embodiment provides a novel electric line structure which achieves the high speed modulation of semiconductor laser 18, while ensuring cooling performance of semiconductor laser 18.

Figure 4:
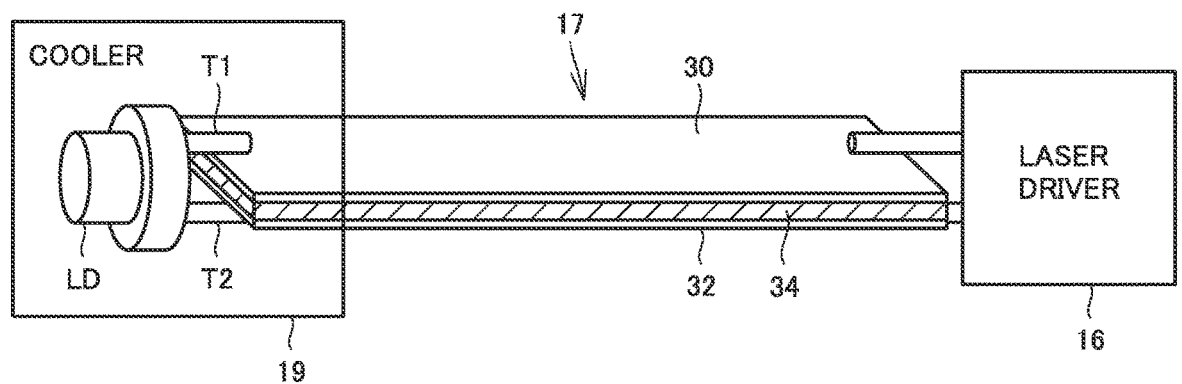
FIG. 4 is a diagram showing an electric line structure between a laser driver and a semiconductor laser which are included in the transmitter according to the embodiment.

FIG. 4 is a diagram showing an electric line structure between laser driver 16 and semiconductor laser 18 included in transmitter 11 according to the embodiment.

Figure 5:
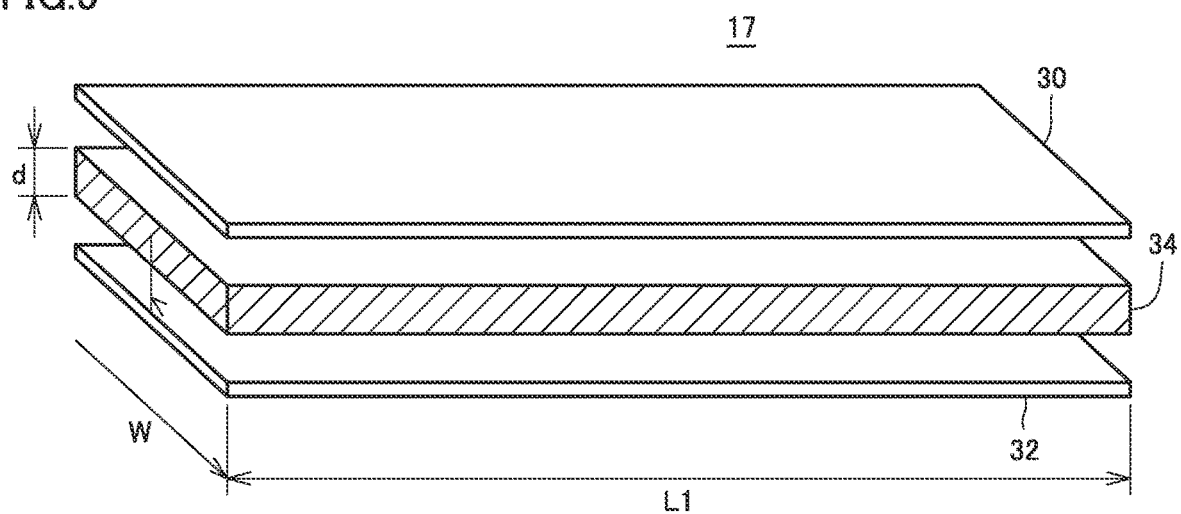
FIG. 5 is a developed view of an electric line shown in FIG. 4.

Referring to FIG. 4, electric line 17 is a wire in the form of a tape. FIG. 5 is a developed view of electric line 17.

Referring to FIGS. 4 and 5, electric line 17 has a first conductive layer 30, a second conductive layer 32, and an insulating layer 34 which are extending in the longitudinal direction of the wire. First conductive layer 30, insulating layer 34, and second conductive layer 32 are stacked in the direction of thickness of electric line 17.

A metallic material, such as copper or aluminum, can be used as a material from which conductive layers 30, 32 are formed. Conductive layers 30, 32 are covered with an insulator film. A resin material, such as polyethylene or fluorine resin, can be used as a material from which insulating layer 34 is formed. Electric line 17 can be formed by laminating conductive layers 30, 32 and insulating layer 34 with an adhesive material. Conductive layers 30, 32 and insulating layer 34 are flexible. Thus, electric line 17 is flexible.

First conductive layer 30 has a first end electrically connected to anode terminal T1 of laser diode LD, and a second end electrically connected to laser driver 16. Second conductive layer 32 has a first end electrically connected to cathode terminal T2 of laser diode LD, and a second end electrically connected to laser driver 16.

In the following description, the length of electric line 17 (conductive layers 30, 32 and insulating layer 34) in the longitudinal direction is represented as L1, and the width of electric line 17 is represented as W. The thickness of insulating layer 34 is represented as d. Thickness d corresponds to spacing between first conductive layer 30 and second conductive layer 32. Conductive layers 30, 32 and insulating layer 34 have thicknesses of about a few micrometers to about tens of micrometers.

According to the configuration shown in FIG. 4, a path of the high frequency current is formed between laser driver 16 and laser diode LD, in which first conductive layer 30 is the outbound path and second conductive layer 32 is the return path. Electric line 17 has inductance L dependent on the area of the loop forming the current path. Inductance L of electric line 17 decreases with a decrease in the area of the loop.

In the present embodiment, the area of the loop forming the current path can be reduced by reducing the spacing between first conductive layer 30 and second conductive layer 32, that is, thickness d of insulating layer 34. Accordingly, inductance L of electric line 17 can be reduced.

With this, the inductance per unit length of the electric line can be reduced, as compared to the conventional electric line structure shown in FIG. 3, thereby achieving a reduction of the voltage drop caused by the length of the electric line. Accordingly, even if the length of the electric line is limited by installation of cooler 19, an increase in voltage applied to laser diode LD can be inhibited. As a result, the high speed modulation of semiconductor laser 18 is allowed, while ensuring cooling performance of semiconductor laser 18.

On the other hand, there is capacitance C between first conductive layer 30 and second conductive layer 32 in electric line 17. Capacitance C of electric line 17 is proportional to the areas of conductive layers 30, 32, and inversely proportional to thickness d of insulating layer 34. In other words, capacitance C increases with a decrease in thickness d of insulating layer 34. Capacitance C increases with an increase in the areas of conductive layers 30, 32. Thus, when length L1 of conductive layers 30, 32 is fixed, capacitance C increases with an increase in width W of conductive layers 30, 32.

Here, the characteristic impedance of electric line 17 can be approximated with $Z=(L/C)^{1/2}$, where Z denotes the characteristic impedance of electric line 17, L denotes the inductance of electric line 17 and C denotes the capacitance of electric line 17. For example, reflection of the high frequency current is reduced by matching the characteristic impedance of electric line 17 to the characteristic impedance of laser diode LD, thereby highly efficiently supplying the high frequency current to laser diode LD. In other words, widths W of conductive layers 30, 32 and thickness d of insulating layer 34 need to be adjusted so that the characteristic impedance of electric line 17 matches the characteristic impedance of laser diode LD.

FIGS. 6A and 6B show design concepts of electric line 17 according to the present embodiment. FIG. 6A shows electric line 17 that has the same configuration as electric line 17 shown in FIGS. 4 and 5. FIG. 6B shows electric line 17 having an increased number of conductive layers and insulating layers stacked in electric line 17 shown in FIGS. 4 and 5. Electric line 17 shown in FIG. 6A and electric line 17 shown in FIG. 6B have the same length L1.

With the configuration of FIG. 6A, inductance L and capacitance C of electric line 17 are adjustable by thickness d of insulating layer 34. Specifically, if thickness d of insulating layer 34 is reduced, inductance L reduces while capacitance C increases. Capacitance C is also adjustable by width W1 of conductive layers 30, 32. Specifically, if width W1 of conductive layers 30, 32 is increased, capacitance C increases.

With the configuration of FIG. 6A, however, if the space for installing laser driver 16 and laser diode LD is tight, there is a concern that the upper limit for width W1 of conductive layers 30, 32 may be limited. When the installation layout is constrained as such, the configuration as shown in FIG. 6B can be employed.

With the configuration of FIG. 6B, second conductive layer 32A is stacked on a first surface of first conductive layer 30 with insulating layer 34A in between. Second conductive layer 32B is stacked on a second surface of first conductive layer 30 with insulating layer 34B in between, the second surface being opposite the first surface. First conductive layer 30 has a first end electrically connected to an anode of laser diode LD, and a second end electrically connected to laser driver 16. Second conductive layers 32A, 32B each have a first end electrically connected in parallel with a cathode of laser diode LD, and a second end electrically connected in parallel with laser driver 16.

With the configuration of FIG. 6B, a state is formed in which (i) the capacitance formed of a stack of first conductive layer 30, insulating layer 34A, and second conductive layer 32A and (ii) the capacitance formed of a stack of first conductive layer 30, insulating layer 34B, and second conductive layer 32B, are electrically connected in parallel. With this, capacitance C of the entire electric line 17 is equal to the sum of these two capacitances.

According to the configuration of FIG. 6B, the number of parallel connections of capacitances is substantially increased by increasing the number of conductive layers and insulating layers stacked, thereby increasing capacitance C of electric line 17. Accordingly, even if width W2 of electric line 17 is less than width W1 of electric line 17 shown in FIG. 6A, capacitance C equivalent to electric line 17 of FIG. 6A can be obtained by adjusting the number of stacked layers. With this, the characteristic impedance of electric line 17 can be matched to the characteristic impedance of laser diode LD even when the installation layouts for laser driver 16 and laser diode LD are constrained.

Note that optimal values for inductance L and capacitance C of electric line 17 can be determined in accordance with high frequently characteristics (current-voltage characteristics) of laser diode LD to which electric line 17 is connected. Specifically, in order to pass a large current through laser diode LD, the magnetic energy stored in inductance L of electric line 17 is increased. Thus, a reduction in inductance L is required in order to suppress the magnetic energy. In contrast, if a small current is passed through laser diode LD while a high voltage is applied thereto, the electrical energy stored in capacitance C of electric line 17 is increased. Thus, a reduction in capacitance C is required in order to suppress the electrical energy. Laser diode LD can be highly efficiently driven by adjusting inductance L and capacitance C of electric line 17 in accordance with high frequently characteristics of laser diode LD so that the magnetic energy and the electrical energy are balanced. Consequently, power saving of transmitter 11 can be allowed.

(Other Example Configurations)

In the above-described embodiment, while semiconductor laser 18 has been illustrated as output laser light from a single laser diode LD, multiple laser light beams output from multiple laser diodes can be combined into one optical fiber and transmitted.

Figure 7:
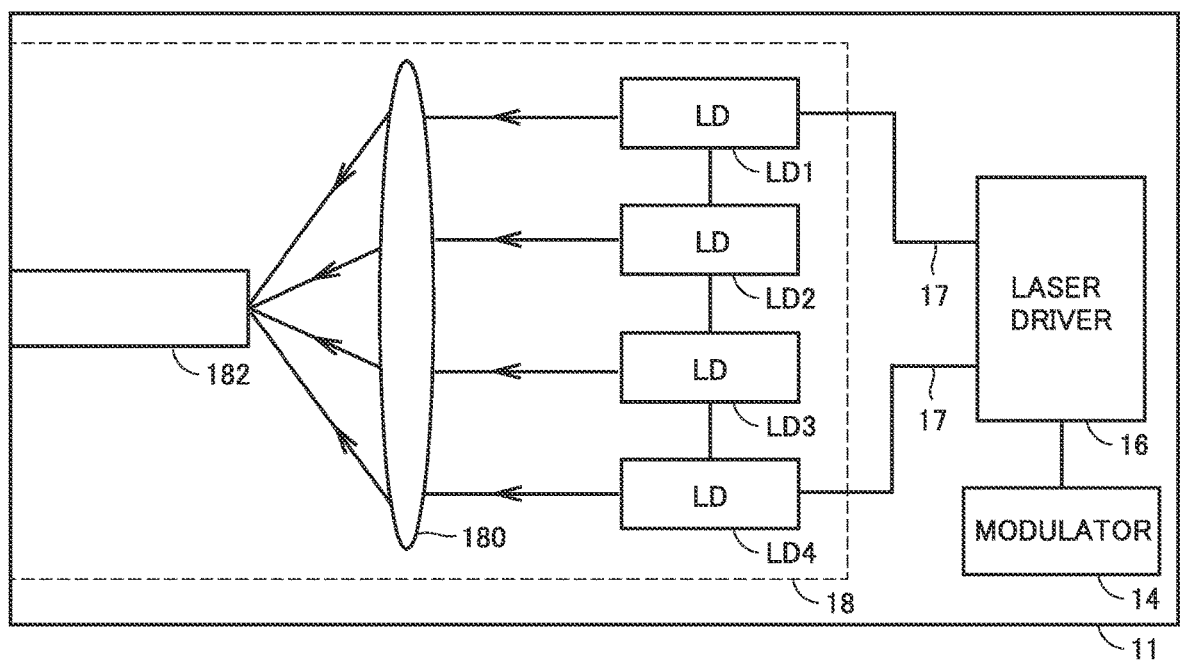
FIG. 7 is a diagram showing a configuration of the transmitter according to Variation 1.

FIG. 7 is a diagram showing a configuration of transmitter 11 according to Variation 1.

Referring to FIG. 7, semiconductor laser 18 includes multiple (e.g., four) laser diodes LD1 to LD4, a coupling lens 180, and an optical fiber 182. Multiple laser diodes LD1 to LD4 are electrically connected in series. Laser diode LD1 has an anode electrically connected to laser driver 16 via electric line 17. Laser diode LD4 has a cathode electrically connected to laser driver 16 via electric line 17.

The high frequency current output from laser driver 16 is supplied via electric line 17 to the series circuit formed of laser diodes LD1 to LD4. Laser diodes LD1 to LD4 are each driven by the high frequency current, and output laser light.

The multiple laser light beams output from laser diodes LD1 to LD4 are combined by coupling lens 180, and then guided to optical fiber 182. The high power laser light can be output through optical fiber 182.

In Variation 1, inductance L and capacitance C of electric line 17 are adjusted so that the characteristic impedance of electric line 17 matches the characteristic impedance of the series circuit formed of laser diodes LD1 to LD4. Widths W of conductive layers 30, 32 included in electric line 17 and thickness d of insulating layer 34 included in electric line 17 are determined in accordance with inductance L and capacitance C of electric line 17.

According to transmitter 11 of Variation 1, the same high frequency current flows through multiple laser diodes LD1 to LD4. Laser driver 16A needs to apply, to semiconductor laser 18, a voltage that is equal to the sum of voltages applied to multiple laser diodes LD1 to LD4. An increased voltage is applied from laser driver 16, as compared to the case in which a single laser diode LD is driven, and thus the electrical energy stored in capacitance C of electric line 17 increases. For this reason, it is contemplated that capacitance C of electric line 17 needs to be adjusted to be low, as compared to electric line 17 when a single laser diode LD is driven by laser driver 16.

Figure 8:
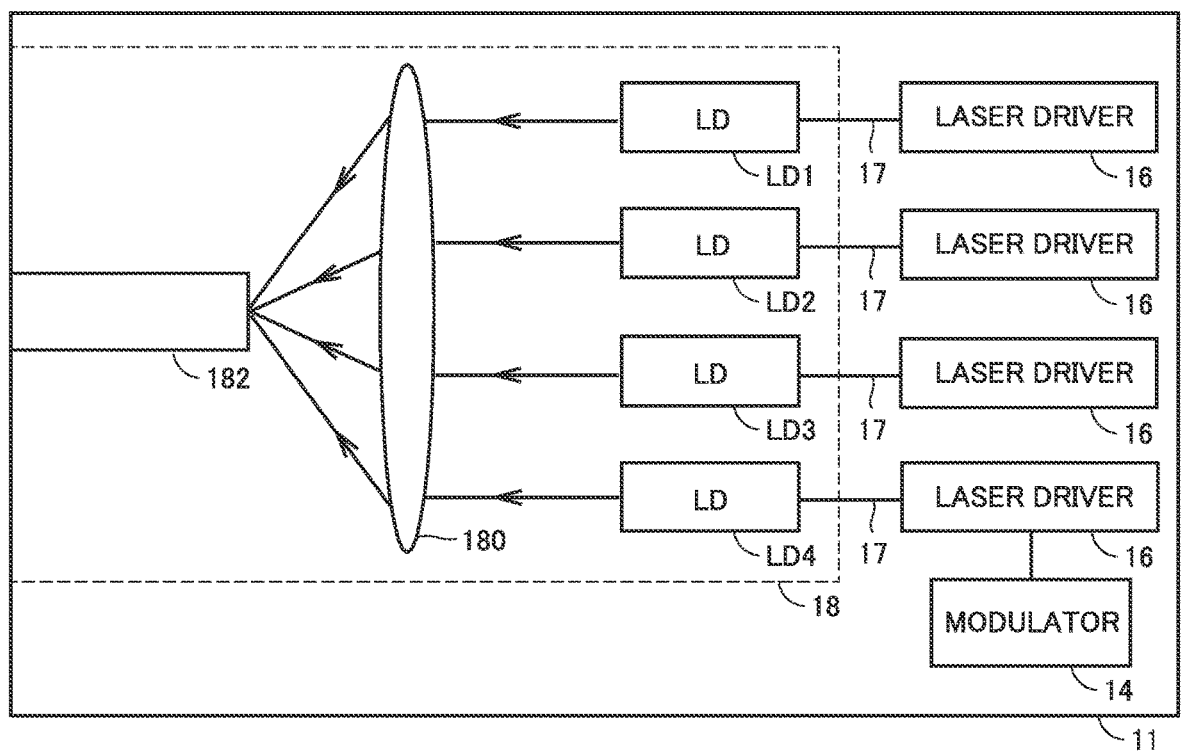
FIG. 8 is a diagram showing a configuration of the transmitter according to Variation 2.

FIG. 8 is a diagram showing a configuration of transmitter 11 according to Variation 2.

Referring to FIG. 8, transmitter 11 according to Variation 2 is the same as transmitter 11 according to Variation 1 shown in FIG. 7, except for having multiple (e.g., four) laser drivers 16. The configuration of semiconductor laser 18 is the same as Variation 1, and thus the description thereof will be omitted.

In Variation 2, multiple laser drivers 16 are provided in one-to-one correspondence with multiple laser diodes LD1 to LD4. Laser diodes LD1 to LD4 are each receive supply of the high frequency current from a corresponding one of the laser drivers 16 and driven, and output laser light.

Inductance L and capacitance C of each of multiple electric lines 17 are adjusted so that the characteristic impedance of electric line 17 matches the characteristic impedance of a corresponding laser diode LD. Widths W of conductive layers 30, 32 of electric line 17 and thickness d of insulating layer 34 of electric line 17 are determined in accordance with inductance L and capacitance C of electric line 17.

According to transmitter 11 of Variation 2, while the same number of laser driver 16 as the total number of laser diodes LD needs to be installed, the high frequency currents that are passed through individual laser diodes LD can be controlled independent of one another. Accordingly, for example, multiple laser diodes LD1 to LD4 can be configured of laser diodes that outputs different color laser light beams. Alternatively, multiple laser diodes LD1 to LD4, even if they output the same color laser light, can be driven by different currents or voltages. In such as case also, highly efficient, high power transmitter 11 is implemented by adjusting the characteristic impedances of individual electric lines 17 in accordance with the characteristic impedance of individual laser diodes LD.

While the embodiment described above has been described with reference to a communication device as an application of the laser device according to the present invention, it should be noted that the laser device according to the present invention is widely applicable to any transmitters that output laser light. For example, the laser device according to the present invention is also applicable to laser radars which uses laser light modulated at high speed to measure a distance to an object.

[Aspects]

A person skilled in the art would understand that the exemplary embodiments described above are specific examples of the following aspects.

(Item 1) A laser device according to one aspect includes: a semiconductor laser; at least one driver that supplies the semiconductor laser with a current; a modulator that modulates the current to be supplied to the semiconductor laser; and at least one electric line for conveying the current from the at least one driver to the semiconductor laser. The at least one electric line is a wire in a form of a tape, and includes a first conductive layer, a second conductive layer, and an insulating layer that are extending in a longitudinal direction of the wire. The first conductive layer and the second conductive layer are stacked, with the insulating layer in between, in the direction of thickness of the wire.

According to the laser device of item 1, the inductance of the electric line for supplying the high frequency current from the laser driver to the semiconductor laser can be reduced. Thus, the voltage drop caused by the length of the electric line can be reduced, as compared to a conventional electric line structure which uses a twisted pair of wires or a coaxial cable. With this, an increase in the voltage, applied to the semiconductor laser to compensate for the voltage drop in the electric line, can be inhibited. As a result, the high speed modulation of the semiconductor laser is allowed.

(Item 2) The laser device according to item 1, further comprising a cooler that cools the semiconductor laser, the cooler being thermally connected to the semiconductor laser.

According to the laser device of item 2, an increase in applied voltage to the semiconductor laser can be inhibited even if the length of the electric line is limited by installation of the cooler for cooling the semiconductor laser. As a result, the high speed modulation of the semiconductor laser is allowed while ensuring cooling performance of the semiconductor laser.

(Item 3) The laser device according to item 1 or item 2, wherein the semiconductor laser has a single laser diode. The at least one driver is a single driver. The first conductive layer has a first end connected to an anode of the single laser diode, and a second end connected to the single driver. The second conductive layer has a first end connected to a cathode of the single laser diode, and a second end connected to the single driver According to the laser device of item 3, the high speed modulation of a large output of the laser diode is allowed, while ensuring its cooling performance.

(Item 4) The laser device according to item 1 or item 2, wherein the semiconductor laser has a plurality of laser diodes which are electrically connected in series. The at least one driver is a single driver. The first conductive layer has a first end connected to a first end of a series circuit formed of the plurality of laser diodes, and a second end connected to the single driver. The second conductive layer has a first end connected to a second end of the series circuit formed of the plurality of laser diodes, and a second end connected to the single driver.

According to the laser device of item 4, the high speed modulation of the plurality of laser diodes connected in series is allowed, while ensuring their cooling performance.

(Item 5) The laser device item 1 or item 2, wherein the semiconductor laser has a plurality of laser diodes. The semiconductor laser has a plurality of laser diodes. The at least one driver is a plurality of drivers that supply a plurality of currents to the plurality of laser diodes, the plurality of currents comprising the current. The at least one electric line is a plurality of electric lines. The plurality of electric lines convey the plurality of currents to the plurality of laser diodes.

According to the laser device of item 5, the high speed modulation of the plurality of laser diodes is allowed, while ensuring their cooling performance.

(Item 6) The transmitter according to one aspect, includes the laser device according to any of items 1 to 5.

According to transmitter 11 of item 6, the high speed modulation of the semiconductor laser is allowed, while ensuring cooling performance of the semiconductor laser. As a result, a transmitter capable of outputting high power laser light is implemented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A laser device, comprising:
   a semiconductor laser;
   at least one driver that supplies the semiconductor laser with a current;
   a modulator that modulates the current to be supplied to the semiconductor laser; and
   at least one electric line for conveying the current from the at least one driver to the semiconductor laser, wherein
   the at least one electric line is a wire in a form of a tape, and includes a first conductive layer, a second conductive layer, and an insulating layer that are extending in a longitudinal direction of the wire, and
   the first conductive layer and the second conductive layer are stacked, with the insulating layer in between, in the direction of thickness of the wire.

2. The laser device according to claim 1, further comprising
   a cooler that cools the semiconductor laser, the cooler being thermally connected to the semiconductor laser.

3. The laser device according to claim 1, wherein
   the semiconductor laser has a single laser diode,
   the at least one driver is a single driver,
   the first conductive layer has a first end connected to an anode of the single laser diode, and a second end connected to the single driver, and
   the second conductive layer has a first end connected to a cathode of the single laser diode, and a second end connected to the single driver.

4. The laser device according to claim 2, wherein
   the semiconductor laser has a single laser diode,
   the at least one driver is a single driver,
   the first conductive layer has a first end connected to an anode of the single laser diode, and a second end connected to the single driver, and
   the second conductive layer has a first end connected to a cathode of the single laser diode, and a second end connected to the single driver.

5. The laser device according to claim 1, wherein
   the semiconductor laser has a plurality of laser diodes which are electrically connected in series and form a series circuit,
   the at least one driver is a single driver,
   the first conductive layer has a first end connected to a first end of the series circuit, and a second end connected to the single driver, and
   the second conductive layer has a first end connected to a second end of the series circuit, and a second end connected to the single driver.

6. The laser device according to claim 2, wherein
   the semiconductor laser has a plurality of laser diodes which are electrically connected in series and form a series circuit,
   the at least one driver is a single driver,
   the first conductive layer has a first end connected to a first end of the series circuit, and a second end connected to the single driver, and
   the second conductive layer has a first end connected to a second end of the series circuit, and a second end connected to the single driver.

7. The laser device according to claim 1, wherein
   the semiconductor laser has a plurality of laser diodes,
   the at least one driver is a plurality of drivers that supply a plurality of currents to the plurality of laser diodes, and
   the at least one electric line is a plurality of electric lines that convey the plurality of currents to the plurality of laser diodes.

8. The laser device according to claim 2, wherein
   the semiconductor laser has a plurality of laser diodes,
   the at least one driver is a plurality of drivers that supply a plurality of currents to the plurality of laser diodes, and
   the at least one electric line is a plurality of electric lines that convey the plurality of currents to the plurality of laser diodes.

9. A transmitter, comprising the laser device according to claim 1.

10. A transmitter, comprising the laser device according to claim 2.

11. The laser device according to claim 1, wherein the electric line is flexible.

12. The laser device according to claim 3, wherein
    the at least one electric line includes a third conductive layer,
    wherein the first conductive layer, the second conductive layer and the third conductive layer are stacked with the first conductive layer being positioned between the second conductive layer and the third conductive layer,
    wherein the third conductive layer has a first end connected to the cathode of the single laser diode and a second end connected to the single driver.

* * * * *